US008910369B2

(12) United States Patent
Herbsommer et al.

(10) Patent No.: US 8,910,369 B2
(45) Date of Patent: Dec. 16, 2014

(54) FABRICATING A POWER SUPPLY CONVERTER WITH LOAD INDUCTOR STRUCTURED AS HEAT SINK

(71) Applicant: Texas Instruments Incorporated, Dallas, TX (US)

(72) Inventors: Juan A Herbsommer, Allen, TX (US); Osvaldo J Lopez, Annandale, NJ (US); Jonathan A Noquil, Bethlehem, PA (US); David Jauregui, Bethlehem, PA (US); Lucian Hriscu, Freemansburg, PA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/275,009

(22) Filed: May 12, 2014

(65) Prior Publication Data

US 2014/0245598 A1 Sep. 4, 2014

Related U.S. Application Data

(62) Division of application No. 13/247,650, filed on Sep. 28, 2011, now Pat. No. 8,760,872.

(51) Int. Cl.
| H05K 7/20 | (2006.01) |
| H02M 3/00 | (2006.01) |
| H01R 43/26 | (2006.01) |
| H02B 1/48 | (2006.01) |

(52) U.S. Cl.
CPC .............. *H02M 3/00* (2013.01); *H01R 43/26* (2013.01); *H02B 1/48* (2013.01)
USPC .............................. 29/592.1; 29/825; 361/704

(58) Field of Classification Search
CPC . H05K 13/00; H05K 7/20436; H05K 1/0203; H05K 7/2039
See application file for complete search history.

(56) References Cited

U.S. PATENT DOCUMENTS

| 5,185,691 | A | * | 2/1993 | Korinsky ....................... 361/720 |
| 5,258,888 | A | * | 11/1993 | Korinsky ....................... 361/704 |
| 6,034,005 | A | * | 3/2000 | Diehl ............................. 442/164 |
| 7,443,661 | B2 | * | 10/2008 | Xu et al. ................... 361/679.55 |
| 2013/0097851 | A1 | * | 4/2013 | Weiss et al. .................. 29/592.1 |
| 2013/0322016 | A1 | * | 12/2013 | Jones et al. .................... 361/689 |
| 2014/0168900 | A1 | * | 6/2014 | Korich et al. ................. 361/709 |

* cited by examiner

*Primary Examiner* — Gregory Thompson
(74) *Attorney, Agent, or Firm* — Steven A. Shaw; Frederick J. Telecky, Jr.

(57) ABSTRACT

A method for fabricating a power supply converter comprises a load inductor wrapped by a metal sleeve structured to transform the inductor into a heat sink positioned to deposit layers of solder paste on a sleeve surface and on the inductor leads. A metal carrier having a portion of a first thickness and portions of a greater second thickness is placed on the solder layers of the inductor. The carrier portion of first thickness is aligned with the inductor sleeve. The carrier portions of second thickness are aligned with the inductor leads. A sync and a control FET are placed side-by-side on solder layers deposited on the carrier portion of first thickness opposite the inductor sleeve. Reflowing is preformed and the solder layers are solidified. The FETs, the carrier and the inductor become integrated and the un-soldered surfaces of the FETs and the carrier portions of second thickness become coplanar.

2 Claims, 3 Drawing Sheets

FIG. 4

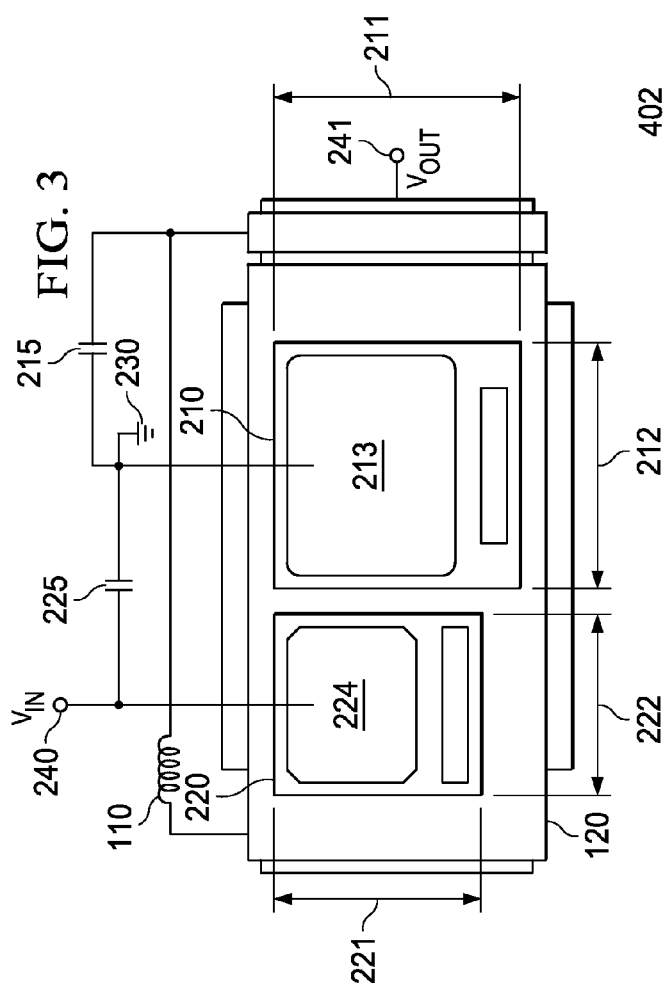
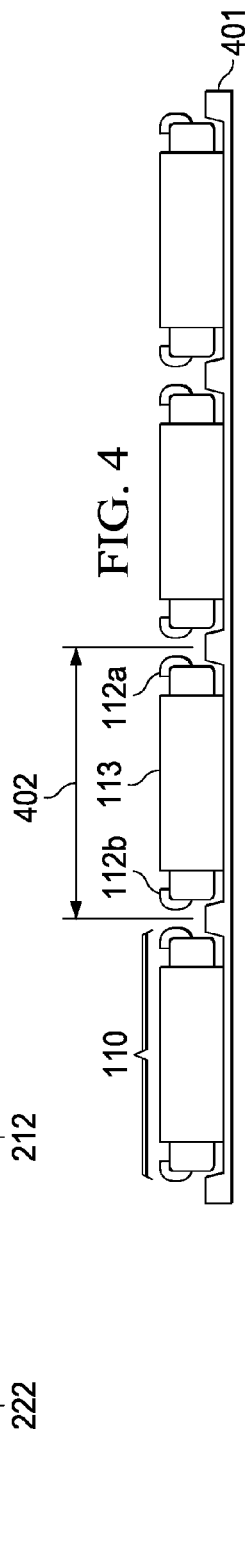
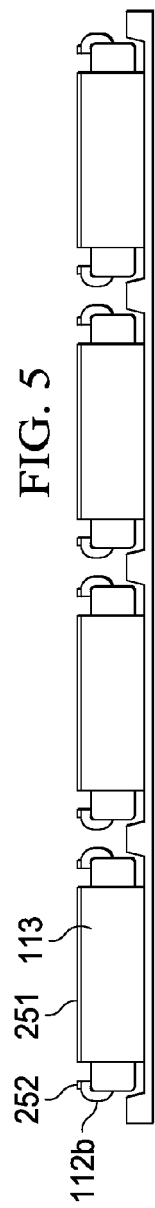

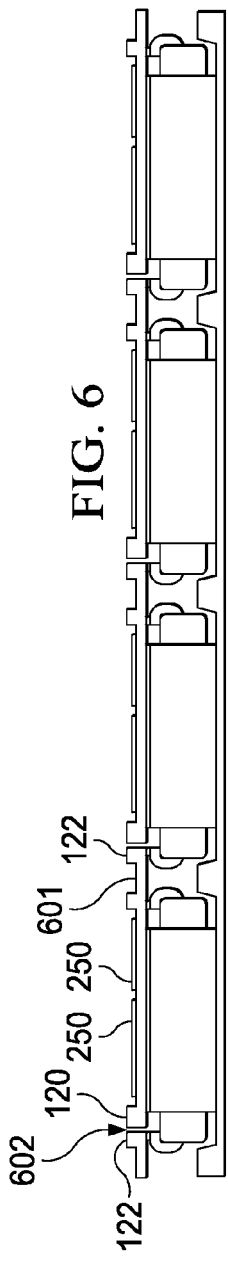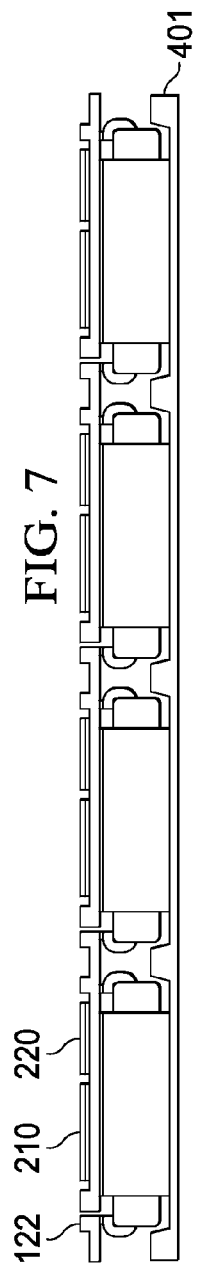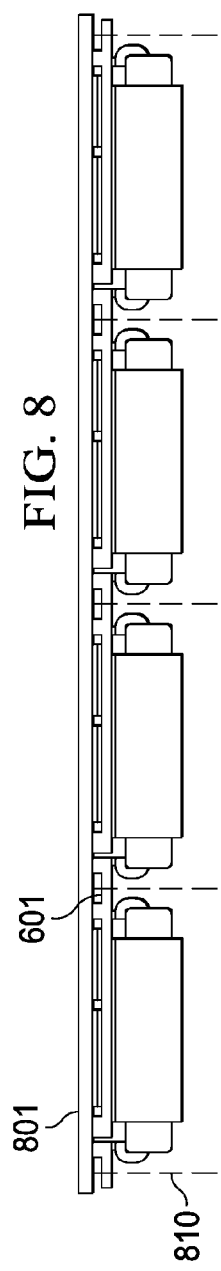

FABRICATING A POWER SUPPLY CONVERTER WITH LOAD INDUCTOR STRUCTURED AS HEAT SINK

CROSS-REFERENCE TO RELATED APPLICATIONS

This application is a Divisional of and claims priority to U.S. patent application Ser. No. 13/247,650, filed Sep. 28, 2011. Said application incorporated herein by reference.

FIELD

The invention is related in general to the field of semiconductor devices and processes, and more specifically to structure and fabrication method of a multi-component electronic system including a load inductor structured as a heat sink and vertically integrated with a DC-DC converter half-bridge.

DESCRIPTION OF RELATED ART

Electronic products in commercial applications such as telecom, home audio, and regulator products often need systems, which can switch power supplies, regulate and stabilize voltages, and work as dc-dc converters. These systems not only need to have high efficiency to operate properly, but should preferably also have small lateral and thickness dimensions, and require very low cost.

As an example of a system, popular power switches involve a rectangular metal leadframe of 15 by 9 mm outline, on which a plurality of discrete electronic components are assembled and then, as a unit, overmolded with a plastic encapsulation compound by a transfer molding technique. The height of the overmolded power system is between 2.6 and 2.8 mm. The components of a power switch may include wire-bonded and packaged MOS Field Effect Transistors (FETs) with low resistance and large current handling capability; an assortment of resistors and capacitors; and a packaged load inductor as energy storage. In operation, the MOSFETs have to stay cool by effectively dissipating heat through heat spreaders and heat sinks so that they can switch fast (fast transient response). To enhance the cooling, a comb-shaped heat sink is frequently added on top of the overmolded encapsulation. For the volume of the packaged power supply system and for consumption of real estate both of the leadframe and later of a printed circuit motherboard (PBC), the dominant component is the packaged load inductor. As an example, conventional inductors may be square-shaped with a side length of more than 5 mm. Typically, an inductor includes a spirally configured coil of coated copper wire welded to a plated copper leadframe and molded into a magnetic ferrite material.

A MOSFET for a typical power switch has three terminals: The current flows between the source and the drain terminals, and the gate terminal turns this flow on or off. It is common to produce these FETs in plastic molded packages, typically in Quad Flat No-Lead (QFN) or Small Outline Integrated Circuit (SOIC) configuration. Inside the package, the chip is assembled on the pad of a metallic leadframe and connected by bonding wires (usually for the gate) and clips (usually for the current-carrying source and drain) to the leads.

In a Half Bridge used in power supplies, a first FET is coupled with a second FET. Many power supplies accomplish the coupling by assembling both FETs "drain-down" on separate metal pads; the pad of the second FET is then connected by a metal clip to the source of the first FET, whereby the clip represents a common connection or switch node. The pad of the first FET is tied to ground and the source of the second FET is tied to the input terminal. Recently introduced products accomplish the coupling by assembling the first FET "source-down" on a pad tied to ground and the FET's drain coupled to the switch node; the switch node, in turn, is tied to the source of the second FET, whose drain is connected to the input terminal.

In both power supply assemblies described, the switch node is connected to an output load inductor serving as the energy storage of the power supply circuit; the inductor has to be large enough to reliably function for maintaining a constant output voltage. The packaged inductor includes a coil of copper wire wrapped around a core of ferrite. The inductor is encapsulated by a packaging compound, which has cuboid shape and, in one product family, the dimensions 7.25 by 6.8 mm and a height of 2.3 mm. Even for close proximity between inductor and FETs, and to circuitry capacitors, there are connecting traces, which necessarily introduce parasitic resistances and inductances.

SUMMARY OF THE INVENTION

Applicants recognized that the market trend is becoming intolerant for power converter systems, which use conventional side-by-side arrangements of individually packaged FETs and an output load inductor. This arrangement consumes increasingly valuable PCB area. Further, the PCB traces necessary to connect the FETs and the inductor introduce parasitic resistances and inductances, which reduce the converter efficiency. In addition, extra heat sinks are required to provide the essential cooling of the operating FETs necessary to enable them to achieve the specified levels of electrical current.

Analyzing the options for reducing the required PBC assembly area and associated parasitic losses, applicants found that an integration of the inductor with the FETs is impeded not only by the bulky dimensions of the inductor, but also by its irregular and large heat capacitance due to its composition of copper wires surrounded by magnetic ferrite material; the heat capacitance disturbs the action of a comb added to the FETs as a heat sink.

Applicant solved the problem of reducing the PBC area required for assembly and the associated parasitic losses by shaping the load inductor to double as an effective heat sink. The inventive concept includes a vertical stacking of the load inductor over the switch node plate carrying the FETs so that the load current is guided along the FETs and through the inductor; the current-generated heat is channeled through a thick heat-spreading copper sleeve wrapped around the inductor and in touch with the plate into the heat capacity of the ferrite core and especially into the ambient.

As a consequence of this arrangement, the load inductor is integrated with the FETs, saving the valuable PCB assembly area, and the integration is not passive but active since the inductor participates as heat spreader and heat sink to enhance the converter efficiency.

The implementation which embodies the inventive principle is an assembly methodology which first attaches side-by-side a first FET drain-down and a second FET source-down onto a first surface of a conductive carrier as switch node. In the next step, a thermally conducting copper sleeve is wrapped around the encapsulation of the inductor having a ferrite core. Then, the copper-wrapped inductor is aligned with the opposite carrier surface vertically above FETs, and the sleeve is soldered onto carrier. As a side benefit of this methodology, short and tight current loops are created for a load filter capacitor and an input capacitor, reducing parasitic resistance and inductance.

The stacking of the load inductor on top of the FETs reduces about 50% of the consumed PCB area compared to conventional side-by-side placement. This vertical integration enables very short interconnects and circuit loops to reduce parasitic resistances and inductances, and thus to improve power density, efficiency, and switching transients ("ringing"). The morphing of the load inductor into a heat sink enables higher switching currents before the allowed 150° C. junction temperature is reached; as an example, currents up to 35 A can now be handled at 500 to 2000 kHz instead of the conventional 25 A. Further, reduced operating temperature enables higher speed of the DC-DC converter and thus higher efficiency.

BRIEF DESCRIPTION OF THE DRAWINGS

FIG. 3 depicts a bottom view of the power converter of FIG. 1 together with a diagram of circuit loops to a load filter capacitor and a input capacitor.

FIGS. 4 to 8 are cross sections depicting steps of the assembly flow according to the invention for fabricating power converters with vertically attached load inductors.

FIG. 4 shows the step of placing a plurality of copper-wrapped inductors upside down in a support tray.

FIG. 5 shows the step of dispensing a first solder layer on the bottom side of the inductors.

FIG. 6 shows the steps of attaching a conductive carrier to the first solder layer and dispensing second solder layers for attaching FETs.

FIG. 7 shows the steps of attaching FETs on the second solder layers and reflowing all solder layers.

FIG. 8 shows the steps of protecting exposed FET terminals with a temporary tape, removing the support tray, and sawing the conductive carrier for singulating the finished power converters.

DETAILED DESCRIPTION OF THE PREFERRED EMBODIMENTS

Figure 1:
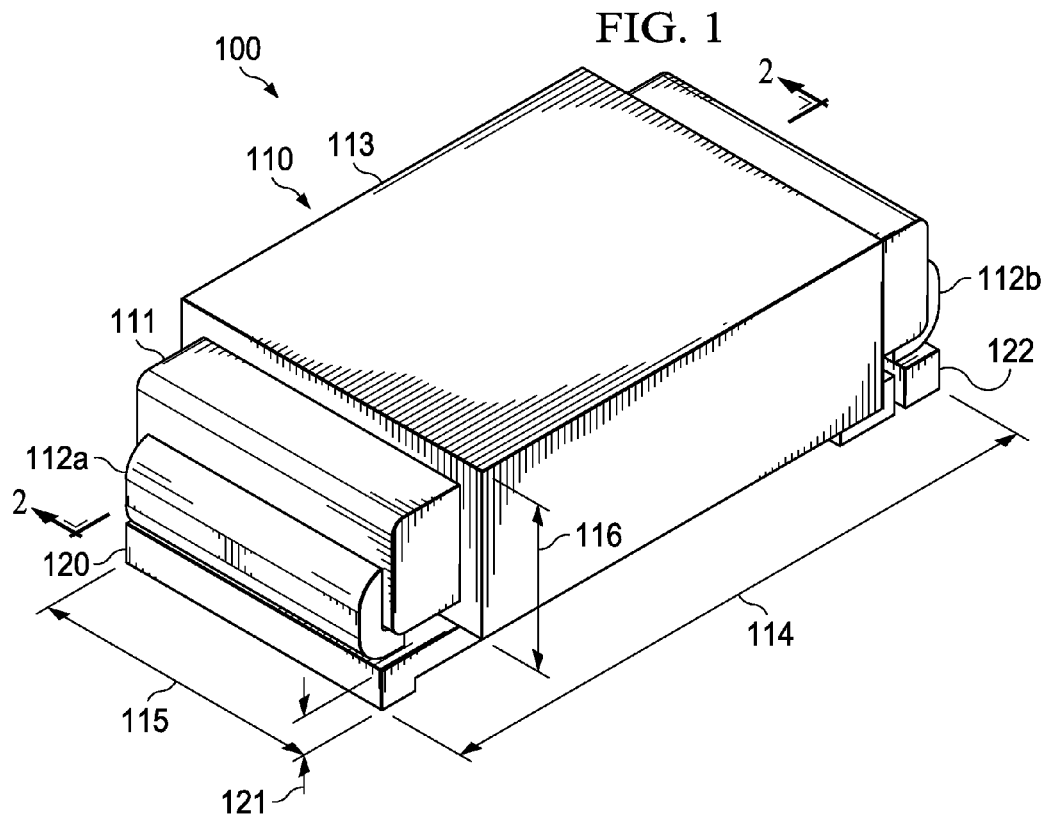
FIG. 1 shows a perspective top view of a load inductor vertically attached to a carrier to form a power converter, wherein the load inductor is wrapped in a copper housing to perform double duty as a heat sink. The line indicates the cross section of FIG. 2.

FIG. 1 shows a perspective top view of an exemplary finished power converter, generally designated 100, with the load inductor 110 vertically integrated with conductive carrier 120, acting as the switch node of the field effect transistors (FETs) (not visible in FIG. 1) of a half-bridge, or synchronous Buck converter. The visibly dominating features of load inductor 110 include housing 111, the leads 112a and 112b to the metal coil inside the ferrite, and the metal sleeve 113 wrapped around the length of the housing. Lead 112b is attached to output terminal 122, which is separated from carrier 120 but made from the same metal sheet (see FIG. 6).

Generally, an inductor such as load inductor 110 includes inside a spirally configured coil of coated metal wire, preferably copper, welded to a plated leadframe, also preferably copper, and molded into a magnetic ferrite material, often called ferrimagnetic in short. The ferrite material is pressed at high pressure, cured, and encapsulated in a housing 111, which may be a hardened molding compound. Generally speaking, a ferrimagnetic material has high electrical resistivity, a spinel crystal structure, and the chemical formula $XFe_2O_4$, wherein X represents any divalent metal ion whose size is such that it will fit into the crystal structure. Due to its composition, inductor 110 has a high thermal capacity.

In the exemplary embodiment of FIG. 1, the carrier 120 of load inductor 110, together with output terminal 122, has an overall length 114 of about 7.34 mm; the carrier width 115, as well as the output terminal width, is about 4.20 mm. The metal sleeve 113 has a height 116 of about 1.60 mm, and the carrier has an additional height 121, which is preferably about 0.25 mm. The line in FIG. 1 indicates where the vertical cutaway through power converter 100 is applied to generate the cross section of converter 100 illustrated in FIGS. 2.

Figure 2:
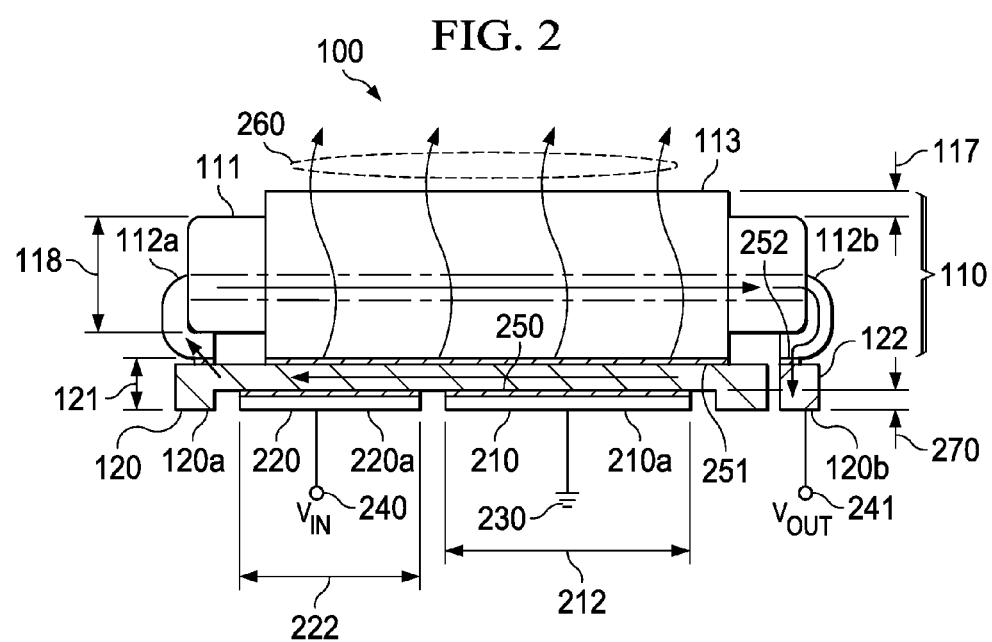
FIG. 2 illustrates a (right angle) cross section of the power converter of FIG. 1 along the line 2. A carrier is assembled with FETs and attached to a copper-wrapped load inductor according to the invention; the load current flowing along the carrier and through the inductor generates heat, which is cooled by the heat-sinking thermal sleeve of the metal sheet wrapped around the inductor.

In FIG. 2, exemplary power converter 100 includes a first chip 210 and a second chip 220. First chip 210 includes the low-side, or synchronous or sync, FET, and chip 220 includes the high-side, or control, FET. Both FETs are assembled on conductive carrier 120, which is preferably a copper plate acting as the switch node of the half-bridge of synchronous Buck converter. FIG. 2 indicates that carrier thickness 121 has a recess or cavity of depth 270 suitable to attach the FETs 210 and 220 onto the recess bottom using a solder layer of a certain thickness. Alternatively, the carrier metal may be provided in two different thicknesses, wherein the thinner portion is for attaching the FETs and the thicker portion serves as the output terminal.

In either case, after the FETs are attached to the carrier, the exposed FET surfaces 210a and 220a are coplanar with the surfaces 120b of the output terminal and any un-recessed carrier surfaces 120a. As FIG. 2 shows, the assembly of chips 210 and 220 is side-by-side and at close proximity. In this example, chip 210 has a larger area than chip 220, and chip 210 and chip 220 have equal thickness, preferably about 0.10 mm; in other embodiments, chip 210 and chip 220 may have different thicknesses, and the value may be larger or smaller than 0.10 mm.

With regard to a comparison of the physical areas and active areas of the sync and control FETS, it should be noted that the duty cycle of a synchronous Buck converter determines the ratio of the active areas needed for the control FET relative to the sync FET, since the resistance $R_{ON}$ of the ON state is inversely proportional to the active chip area. If the anticipated duty cycle is low most of the time (<0.5), the control FET is off and not conducting during most of the operation; and the sync FET is conducting most of the cycle time. To reduce conduction losses of the Buck converter, $P_{LOSS}=I^2 R_{ON}$, it would be favorable to have the sync FET chip 210 with an active area equal to or larger than the active area of the control FET chip 220. Consequently, the sync chip 210 also has a physical area equal to or larger than the physical area of the control chip 220.

It should be noted that in other embodiments the relative position of the FETs may be swapped.

In FIG. 3, which offers a bottom view of the converter, the exemplary converter is shown to have a first power FET (sync FET) 210 with a length 211 of 3.50 mm and a width 212 of 2.84 mm. Second power FET (control FET) 220 has a length 221 of 2.50 mm and a width 222 of 1.80 mm. In the exemplary converter, first FET has its drain conductively attached to carrier 120 and its source 213 tied to ground 230. Capacitor 215 is the load filter capacitor. Second FET 220 has its source conductively attached to carrier 120 and its drain 224 to input terminal 240 (see also FIG. 2). Capacitor 225 is the input capacitor. Consequently, conductive carrier 120 represents the switch node of the converter. The preferred attachment material for both transistor chips is a layer 250 of solder paste; the preferred deposition method is screen printing; alternatively solder dispensing by a syringe may be used. Both transistor chips are attached to the same surface of carrier 120, and in close proximity to each other.

Referring now to FIG. 2, load inductor 110 with its metal sleeve 113 is attached to the surface of carrier 120 opposite the FETs 210 and 220. The attachment of sleeve 113 consumes almost the whole length of the carrier surface; consequently, sleeve 113 is in alignment with the FETs 210 and 220. The sleeve attachment preferably uses the same solder material 251 as attachment layers 250. As mentioned above, the metal sleeve 113 is wrapped around the insulating housing 111 of the inductor's interior ferrite material. The sleeve is preferably formed from a metal sheet with high thermal conductivity such as copper; an exemplary sheet thickness 117 is 0.25 mm. Alternative metals include silver and aluminum, or alloys thereof; alternative thicknesses may be thicker or thinner dependent on the choice of the metal and the allowed range of application. Alternatively, sleeve 113 may be made of materials based on carbon nano-tubes, carbon buckeyballs, and graphene.

In the exemplary embodiment of FIG. 2, housing 111 of the ferrite core has a diameter 118 of 1.00 mm. The leads 112a and 112b of the metal coil inside the ferrite are preferably copper; they may be flat, as shown in FIG. 1, to facilitate soldering to the carrier, but continue inside the inductor as a spirally configured coil of coated metal wire, also preferably copper (the dashed linear representation in FIG. 2 is for clarity's sake). Lead 112a is electrically connected and attached to carrier 120, preferably using a solder layer analogous to layers 250 and 251. Lead 112b is connected to output terminal 122 by a solder layer designated 252; terminal 112 is tied to output voltage $V_{OUT}$ (241).

FIG. 2 includes the current flow through the converter, as indicated by a sequence of arrows. From $V_{IN}$ (240) the current flows along the switch node 120. Since inductor 110 is vertically aligned with switch node 120 and the FETs side-by-side attached to the switch node, the current enters inductor 110 at lead 112a of the metal coil inside the inductor ferrite. Winding around the coil (simplified to a straight arrow in FIG. 2) embedded in the ferrite material, the current exits the inductor through lead 112b, which is connected (preferably by solder) to $V_{OUT}$ terminal 241. Along its way along the switch node and through the inductor, the current generates heat. Since the inductor is surrounded by thermal sleeve 113, and since the sleeve is attached (preferably by solder) to switch node 120 throughout its length, the heat generated by the currents both in the inductor as well as along the switch node can directly enter sleeve 113 in an efficient manner. Consequently, sleeve 213 provides the function of an efficient spreader, sink and radiator of thermal energy. In FIG. 2, the heat sink function is pictorially indicated by arrow waves 260.

As the exemplary embodiment of FIG. 2 illustrates, the current flowing along switch node 120 and through inductor 110 is the active heat-generating component of power converter 100. Inductor 110 by itself would be a thermally inert component of converter 100. However, inductor 110 is in close proximity to the heat-generating component by being vertically positioned and aligned with the FETs attached side-by-side on the switch node. In addition, a thermally conductive housing 111 is provided for the thermally inert component, which is in physical contact with the heat-generating component and structured so that it transforms the thermally inert component into a heat sink for the heat-generating component, which can spread, sink and radiate thermal energy.

An additional circuitry benefit derived from the proximity of inductor 110 to switch node 120 are the short and tight connecting loops for the input capacitor 225 and the load filter capacitor 215, as indicated in FIG. 3. Short interconnecting circuit loops result in reduction of parasitic resistances and inductances. This reduction improves the efficiency of power converter 100, since reduces the power loss:

$$\text{efficiency} = \text{output power/input power}$$
$$= \text{output power/(output power} - \text{power loss)}.$$

The power loss in a synchronous Buck converter is determined by:

$$\text{power loss} = I_L^2 R + P_{SW}$$

(wherein $I_L$=load current, R=intrinsic resistance, $P_{SW}$=switching loss).

For the exemplary embodiment shown in FIGS. 2 and 3, reducing the power loss and increasing the efficiency is achieved by proceeding along two approaches: Reducing switching loss $P_{SW}$ by reducing heat generation from parasitic resistances and inductances, and improving heat dissipation of the operating converter by transforming the thermally inert inductor into a heat sink by means of wrapping the converter in a metal sleeve and attaching the sleeve to the converter.

As a result of the two-pronged efficiency improvement of reduced heat generation and increased heat dissipation, the vertically integrated converter can operate at 25 to 35 A before the transistor junction temperature of 150° C. is reached. Concurrently, the operating frequency can be increased to the range of 500 to 2000 kHz. By operating the synchronous Buck converter at a higher frequency, for instance at 1 MHz instead of the customary 500 kHz, even at substantially unchanged output current and efficiency, allows a customer to reduce transient time response to load and thus the number of passive components, such as capacitors surrounding the converter, saving board real estate and further reducing heat generation. Furthermore, the customer is able reduce the inductance of the output inductor to have the same ripple current, thus lowering the parasitic resistance value of the inductor and reducing power loss at the board level.

By stacking inductor 110 onto carrier 120, vertically aligned with the FETs 210 and 220, about 50% of the PCB surface is saved compared to conventional side-by-side inductor placement on the PCB. Needless to say, the saving of PCB area translates to a significant cost saving.

Another embodiment of the invention is the efficient manufacturing flow outlined in FIGS. 4 to 8 for fabricating DC-DC power converters with vertically integrated load inductors. A re-usable tray 401 is shown in FIG. 4, which provides a plurality of grooves 402 sized for the dimensions of the inductors-to-be-assembled. In the first process step, one inductor 110 each is aligned with, and inserted into, a respective groove 402 of the tray. The inductors 110 are manufactured to have metal sleeves 113 wrapped around the length of the packaged ferrite core of each inductor. Each inductor 110 is positioned so that the leads 112a and 112b of the insulated metal coil inside the ferrite are remote from the tray and thus are facing in a direction which herein is referred to as upward.

In the process step depicted in FIG. 5, solder layers 251 are deposited on the upward-facing metal surfaces of inductor sleeve 113 and inductor leads 112a and 112b; the solder layer on inductor lead 112*b* is designated 252. The preferred deposition method is a screen printing technique.

Next, a sheet of metal is provided, which has been stamped into the plurality of carriers 120 destined for the plurality of inductors 110; further, the height differences discussed in FIG. 2 (between carrier, recess and terminal) have been implemented in the sheet by the stamping or an etching process. While each carrier is separated by a gap 602 from the output terminal of its own inductor, the carrier is interconnected by a strap 601 with the output terminal of the adjacent inductor. The plurality of straps 601 of the metal sheet will be trimmed by the singulation operation as the last step of the assembly process flow (see FIG. 8). In the process step of FIG. 6, the metal sheet is aligned with the inductors 110 so that each inductor's solder layer 251 faces the carrier surface opposite the recess. In the same alignment operation, each inductor lead's solder layer 252 is aligned with output terminal 122. FIG. 6 further shows the process step of depositing the solder layers 250 for attaching the power FET chips in the carrier recess. The preferred solder deposition method is a screening technique for solder paste.

FIG. 7 depicts the step of depositing the FET chips 210 and 220; in addition, FIG. 7 includes the step of reflowing all solder paste layers (251, 252, 250) in a single step of adding thermal energy for reaching the melting temperature and lowering the temperature for solidifying the reflowed solder. after the solder reflow step, the surfaces of chips 210 and 220 and the output terminal 122 are coplanar.

In FIG. 8, a temporary tape 801 is placed across the plurality of assembled converters. Then, temporary tray 401 is removed in order to be available for reuse. Placed on a support table for singulation, straps 601, which served as interconnectors between individual converters, are cut along lines 810, preferably by a rotating saw. Tape 801 may be re-used.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to field effect transistors, but also to other suitable power transistors.

As another example, the invention applies to sleeves surrounding the inductor core, or housings of the inductor, which include structures for enhancing the heat sink functionality such as combs, grooves, and black color.

It is therefore intended that the appended claims encompass any such modifications or embodiments.

We claim:

1. A method for fabricating a power supply converter, comprising:
   providing a load inductor wrapped by a metal sleeve structured to transform the inductor into a heat sink;
   positioning the inductor to deposit layers of solder paste on a sleeve surface and on the inductor leads;
   providing a metal carrier having a portion of a first thickness and portions of a greater second thickness;
   placing the carrier on the solder layers of the inductor wherein the carrier portion of first thickness is aligned with the inductor sleeve and the carrier portions of second thickness are aligned with the inductor leads;
   placing a sync and a control FET side-by-side on solder layers deposited on the carrier portion of first thickness opposite the inductor sleeve; and
   reflowing and then solidifying the solder layers, whereby the FETs, the carrier and the inductor become integrated and the un-soldered surfaces of the FETs and the carrier portions of second thickness become coplanar.

2. The method of claim 1, further comprising before the steps in claim 1:
   providing a re-usable tray having a plurality of grooves sized for the dimensions of a plurality of inductors-to-be-assembled;
   aligning each inductor from the plurality of inductors-to-be-assembled with a respective groove of the tray; and
   inserting each inductor into the respective groove of the tray.

\* \* \* \* \*